US008686502B2

United States Patent
Raghavan et al.

(10) Patent No.: US 8,686,502 B2
(45) Date of Patent: Apr. 1, 2014

(54) SCHOTTKY DIODE INTEGRATED INTO LDMOS

(71) Applicant: Texas Instruments Incorporated, Dallas, TX (US)

(72) Inventors: Venkat Raghavan, Union City, CA (US); Andrew D. Strachan, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/015,029

(22) Filed: Aug. 30, 2013

(65) Prior Publication Data

US 2013/0341705 A1 Dec. 26, 2013

Related U.S. Application Data

(63) Continuation-in-part of application No. 13/506,001, filed on Mar. 19, 2012.

(51) Int. Cl.
*H01L 27/06* (2006.01)

(52) U.S. Cl.
USPC .......................................................... 257/337

(58) Field of Classification Search
CPC ............................ H01L 27/06; H01L 21/8234
USPC .......... 257/343, 337, E21.616, E27.016, 334, 257/E27.06, E29.257, E29.261
See application file for complete search history.

(56) References Cited

U.S. PATENT DOCUMENTS

2005/0285188 A1* 12/2005 Khemka et al. ............... 257/338
2008/0303088 A1* 12/2008 Pang ............................. 257/337

* cited by examiner

*Primary Examiner* — Steven Loke
*Assistant Examiner* — Mouloucoulaye Inoussa
(74) *Attorney, Agent, or Firm* — Eugene C. Conser; Wade J. Brady, III; Frederick J. Telecky, Jr.

(57) ABSTRACT

In an LDMOS device leakage and forward conduction parameters are adjusted by integrating an Schottky diode into the LDMOS by substituting one or more n+ source regions with Schottky diodes.

8 Claims, 6 Drawing Sheets

SCHOTTKY DIODE INTEGRATED INTO LDMOS

RELATED APPLICATION

This application is a Continuation In Part of co-pending application Ser. No. 13/506,001 filed on Mar. 19, 2012. Application Ser. No. 13/506,001 is hereby incorporated by reference herein in its entirety.

FIELD OF THE INVENTION

The invention relates to LDMOS (laterally diffused metal oxide semiconductor) devices. The invention is applicable to LDMOS which is used as a power switch (able to switch amperes of current). The requirements of a POWER MOSFET (like the LDMOS) are to minimize switching losses. In particular it relates to LDMOS devices implemented in a (Bipolar CMOS DMOS) BCD process.

BACKGROUND OF THE INVENTION

LDMOS (laterally diffused metal oxide semiconductor) transistors are commonly used in RF/microwave power amplifiers, e.g., in base-stations where the requirement is for high output power with a corresponding drain to source breakdown voltage usually above 60 volts. These transistors are fabricated by growing an epitaxial silicon layer on a more highly doped silicon substrate.

A typical LDMOS is shown in FIG. 1, which shows a n-epitaxial layer 100 grown on a p-epitaxial layer 102, which, in turn is grown on a p-substrate 104. In this depiction, an n-buried layer 106 is formed in the n-epi 100 on top of the p-epi 102. The LDMOS includes an n+ drain 110 formed in an n-well 112 with an n-drift region 114 extending underneath the poly gate 120. As shown in FIG. 1, the n+ source region 122 is formed in a p-body 124. A p+ implant 126 provides a contact to the p-body. The gate 120 is formed on a gate oxide 130.

One of the drawbacks of an LDMOS device is the conduction loss in the inherent body diode of the device. Also, due to minority carrier accumulation the reverse recovery time is slow. Hence the LDMOS suffers from high dynamic losses due to the slow reverse recovery times.

One prior art solution is to include an external Schottky diode. However due to the high inductance of the package and printed circuit board the benefits are diminished. This is illustrated in the circuit diagram of FIG. 2, which shows a buck converter circuit comprising a high side LDMOS device 200 and a low side LDMOS 202, with external Schottky diode 210. The inductance of the package and the inductance of the PCB are depicted as parasitic stray inductances Lp 220. As shown in FIG. 2, the LDMOS devices 200, 202 both define an internal body diode 240, 242, respectively. The inductance of the external Schottky diode can be reduced by placing the Schottky diode in the same package as the MOSFET, however this requires two devices in the same package, which requires a large amount of space.

SUMMARY OF THE INVENTION

In accordance with an embodiment of the present invention, an apparatus is provided.

The apparatus has at least one Schottky diode integrated into an LDMOS which comprises a substrate; a first layer of lightly doped n-type epitaxial material formed over the substrate; a p-well formed in the first layer, wherein the well has a rectangular surface topology which includes a rectangular aperture in the p-well exposing the under-lying lightly doped n-type material; wherein the long side of the rectangular aperture is aligned with the long side of the p-well and further wherein the sides of the rectangular aperture are inside and spaced apart from the rectangular sides of the p-well; an n+ drain formed in the lightly doped n-type epitaxial region spaced apart from the p-well; at least one Schottky diode formed by providing a metal or metalized region that forms a diode within the surface of the aperture exposing the lightly doped n-type region in the p-well, wherein the metal over the diode forms the anode of the diode; wherein the metalized region comprises a silicide region over surface of the aperture exposing the lightly doped n-type region in the p-well; a source divided into multiple n+ source regions by intermediate p+ body contact regions, wherein the p+ body contact regions between the multiple n+ source regions are configured to increase the safe operating area of the apparatus; a p+ ring coupled to the p-body region and surrounding each at least one Schottky diode, wherein the p+ ring provides edge termination of the at least one Schottky diode to reduce leakage; and a metal layer coupling the n+ source region, the p+ body contact regions and the anodes of the at least one Schottky diode.

In accordance with an embodiment of the present invention, a method of reducing forward conduction loss in an LDMOS device, which comprises integrating a Schottky diode into the LDMOS device by converting part of the LDMOS device into a Schottky diode; wherein the LDMOS device includes a lightly doped n-type region and the Schottky diode is formed by forming a metal or metalized region on the lightly doped n-type region; and wherein the LDMOS includes multiple n+ source regions, wherein the multiple n+ source regions are separated by p-type regions, wherein the p− type regions between the multiple n+ source regions are configured to increase the safe operating area of the LDMOS device.

Further, in accordance with an embodiment of the present invention, a method of reducing reverse recovery time in an LDMOS device, which comprises integrating a Schottky diode into the LDMOS device by converting part of the LDMOS device into a Schottky diode by forming a p− well in a first layer, wherein the p− well has a rectangular surface topology which includes a rectangular aperture in the p-well exposing an under-lying lightly doped n-type material; forming the Schottky diode by forming a metal or metalized region over the lightly doped n-type region; and forming a source divided into multiple n+ source regions by intermediate p+ well contact regions, wherein the p+ well contact regions between the multiple n+ source regions are configured to increase the safe operating area of the LDMOS.

DETAILED DESCRIPTION OF THE INVENTION

The present invention provides an LDMOS device with integrated Schottky diode.

Figure 3:
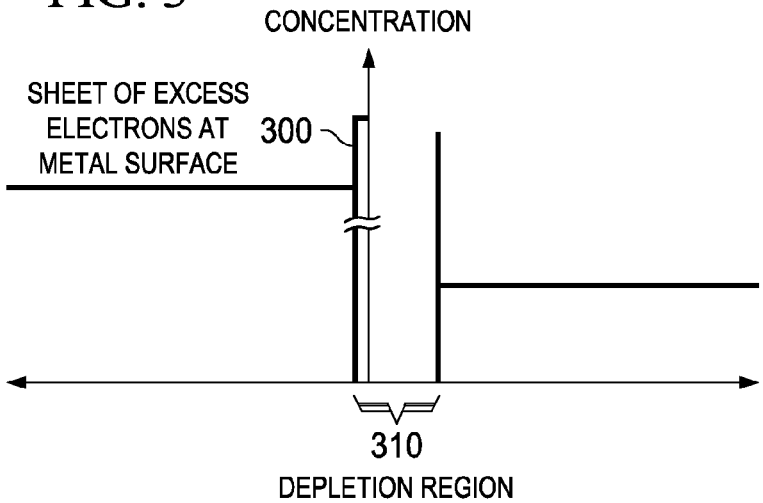
FIG. 3 shows a Schottky diode junction electron distribution diagram.
Figure 4:
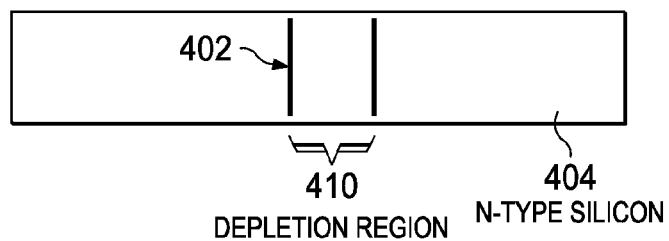
FIG. 4 shows a Schottky diode junction corresponding to the electron distribution diagram of FIG. 2.

Schottky diodes are formed when a metal plate is brought into contact with lightly doped n-type silicon. As depicted in FIGS. 3 and 4, this creates a high concentration of electrons 300 at the surface 402 of the metal plate where it contacts the n-type silicon 404, and a depletion region 310, 410 between the metal plate and the n-type silicon, which shows the electron concentration across the Schottky diode. This provides the Schottky diode with a forward breakdown voltage Vf of about 0.3V compared to about 0.7V for a p-n diode formed between p-type silicon and n type silicon. The benefits of a lower Vf are realized when the LDMOS is implemented in a circuit such as the buck converter of FIG. 2.

Figure 5:
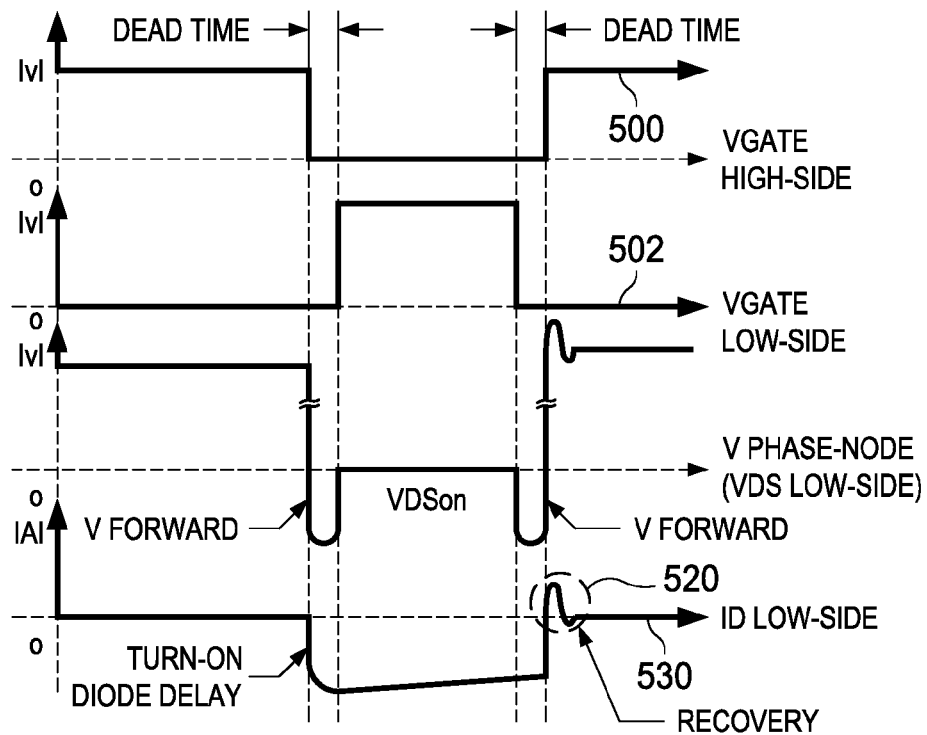
FIG. 5 shows the typical waveforms for a synchronous buck converter.

FIG. 5 shows the typical waveforms for a synchronous buck converter. As can be seen by comparing the voltage waveform on the gate of the high side LDMOS 100 (curve 500) with the voltage waveform on the gate of the low side LDMOS 102 (curve 502) there is a certain dead time (tdeadtime) 510 when the gate voltage on the LDMOS 102 changes but the gate voltage on LDMOS 102 has not yet changed. If Vf is the diode forward voltage, IL is the diode current, and f is the frequency, diode conduction loss is given by Vf×IL× tdeadtime×f. It will therefore be appreciated that the forward conduction loss is dependent on the forward breakdown voltage Vf. Therefore losses will be lower for a Schottky diode with a Vf of only 0.3V compared to the 0.7V for a p-n diode.

The Schottky diode also reduces the reverse recovery loss. Since the Schottky diode is a majority carrier device at low level injection, the minority carrier storage time is eliminated, thereby providing for a faster reverse recover time Trr. Trr is depicted by reference numeral 520 on curve 530.

Figure 2:
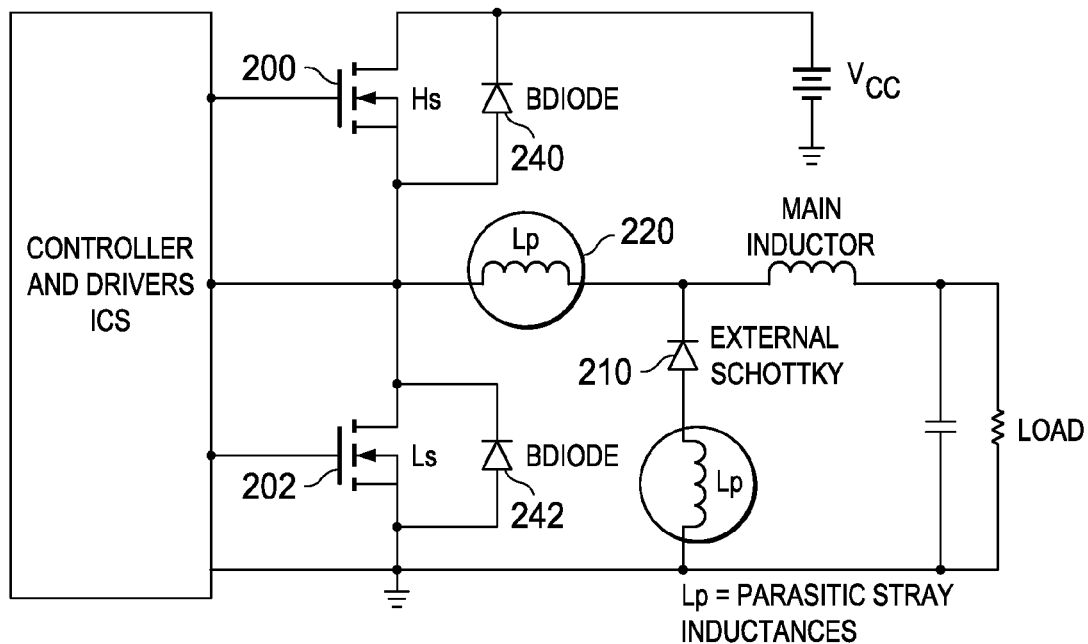
FIG. 2 is a circuit diagram of a prior art buck converter with external Schottky diode.

Consider again the external Schottky diode circuit of FIG. 2. When the high side LDMOS turns on, the low side diode (body diode or external Schottky) has to recover the stored charge, also known as the diode reverse recovery charge Qrr. The diode recovery loss, which is a function of the input voltage Yin and the frequency, is given by Vin×Qrr×f. Since a Schottky diode has a lower Qrr than a regular p-n diode or an internal MOSFET body diode, it provides a lower diode recovery loss.

Figure 6:
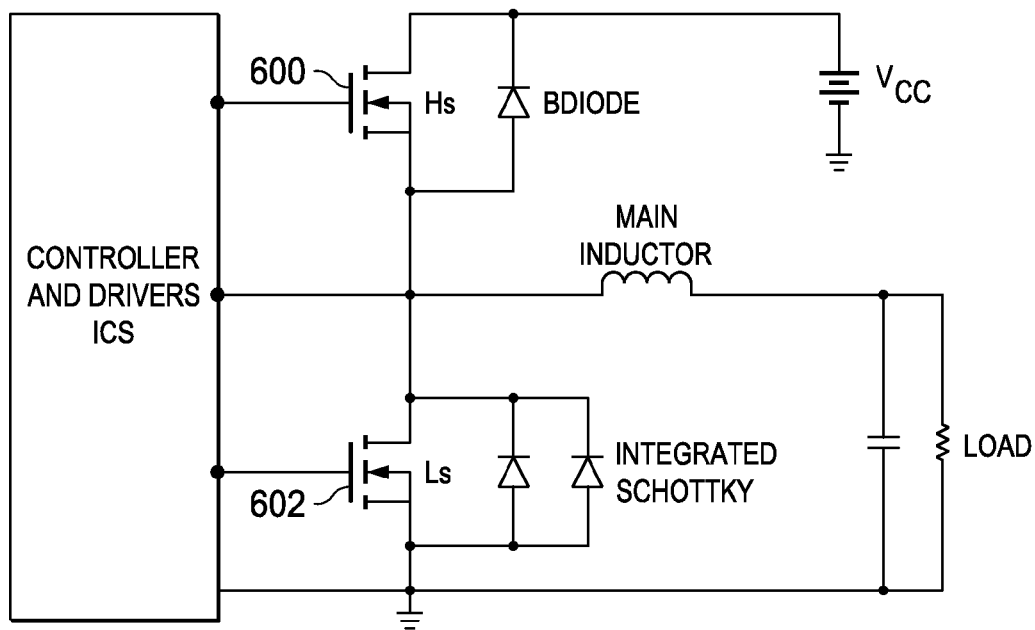
FIG. 6 is a circuit diagram of one implementation of the invention that includes a buck converter with integrated Schottky diode.

The present invention therefore provides substantial loss reduction, both regarding forward conduction losses as well as reverse recovery losses. One implementation of the LDMOS with integrated Schottky is shown in FIG. 6, which shows a buck converter circuit making use of LDMOS devices for the high side and low side devices 600, 602, respectively.

In order to integrate the Schottky diode without adding process steps and thus additional cost, the present invention implements the Schottky diode using the same process steps as those used for the LDMOS. In an LDMOS formed using a BCD process, the Schottky is also implemented in the BCD process flow.

Figure 7:
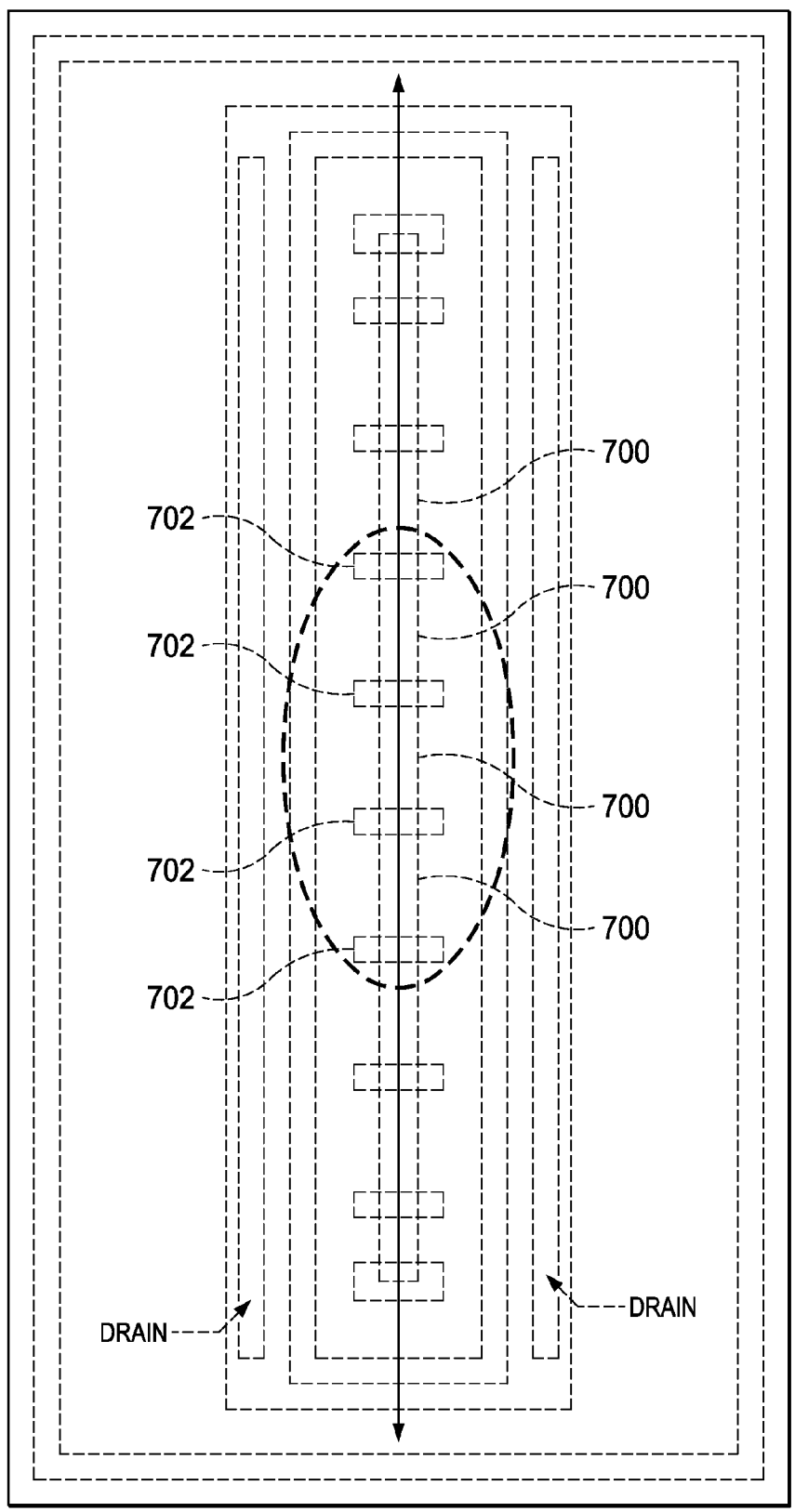
FIG. 7 shows a top view of a prior art LDMOS.
Figure 8:
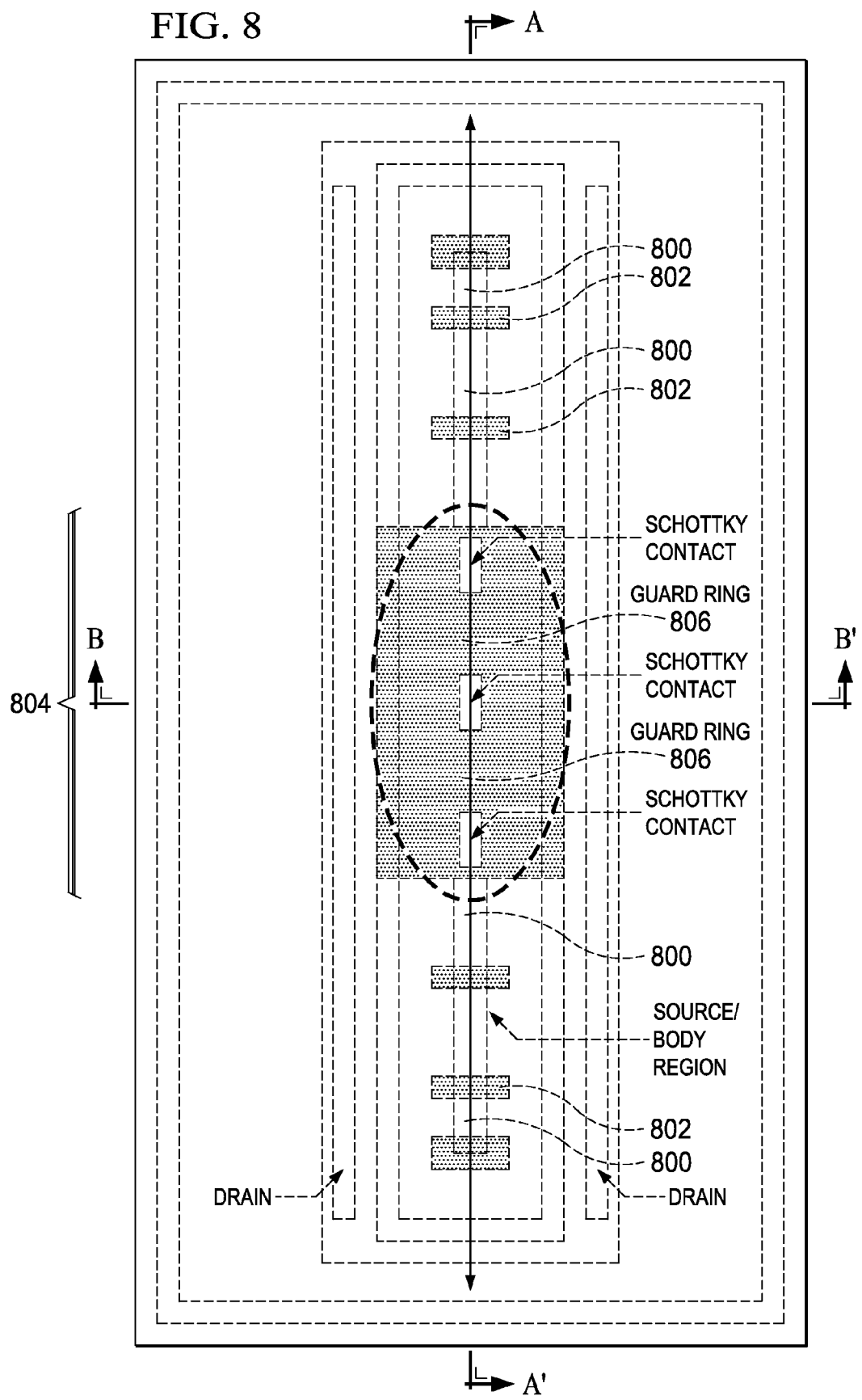
FIG. 8 shows a top view of one embodiment of an LDMOS with integrated Schottky diode of the invention.

FIG. 7 shows a top view of the source side of a typical prior art LDMOS device. The source comprises multiple n+ source regions 700, each separated laterally from the next by a p+ body regions 702, wherein the p+ body contact regions between the multiple n+ source regions are configured to increase the safe operating area of the apparatus. The present invention integrates Schottky diodes into the LDMOS device by eliminating a portion of the p-body underlying of the one or more n+ source regions from the LDMOS. This is shown in FIG. 8, which shows a top view of one embodiment of an LDMOS device of the invention. A section of the p-body and the corresponding source has been eliminated by blocking the deposition of p− and n+ impurities during the formation of the p-body and the source, as depicted by the region 804, which was masked to avoid the formation of a portion of the p-body and the n+ source. In this embodiment, the region 804 covers an area that is separated into three regions by p+ body contacts 806 forming a guard ring as is shown more clearly in the sectional view of FIG. 9, thereby allowing three Schottky diodes to be formed. As can be seen in FIG. 8, the source regions 800 separated by the p+ body regions 802 are shown above and below the blocked region 804 with p+ body regions terminating the source segments at the top and bottoms of the segmented source 800 and p+ body 802 regions, wherein the p+ body contact regions and the multiple n+ source regions are configured to increase the safe operating area of the apparatus. A silicide layer 910 is formed to span the blocked region 804 to define and the anode of the three Schottky diodes. The cathode contact to the Schottky diodes is defined by the drain contact (not shown), which extends to the n-epi 912 via an n-well as best understood from the depiction of an LDMOS in FIG. 1. By determining how many of the n+ source regions are to be blocked it is possible to provide a trade-off between leakage and forward conduction. More or fewer such regions can be blocked to form a greater or smaller Schottky diode area.

Figure 1:
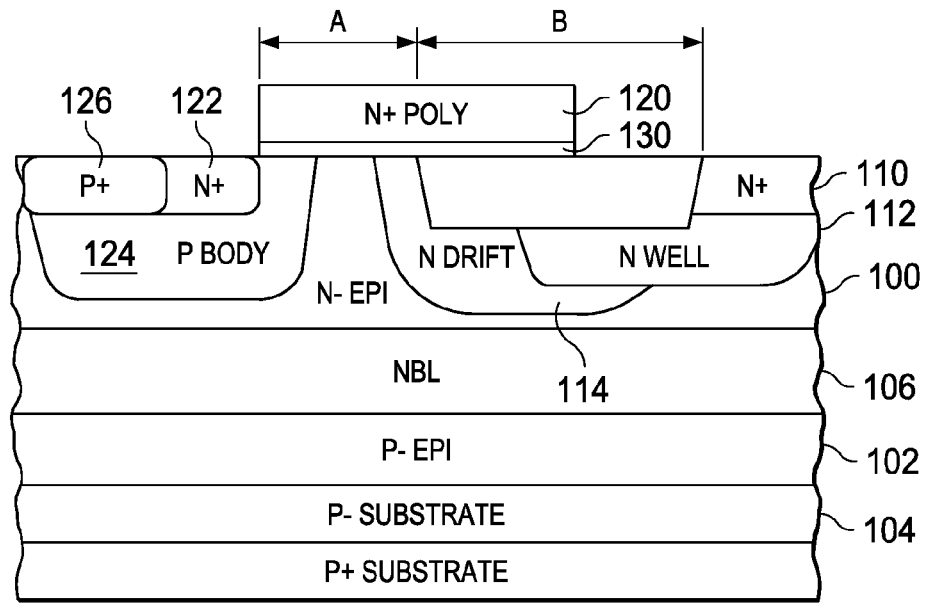
FIG. 1 is a cross-section through a typical LDMOS device as known in the art.
Figure 9:
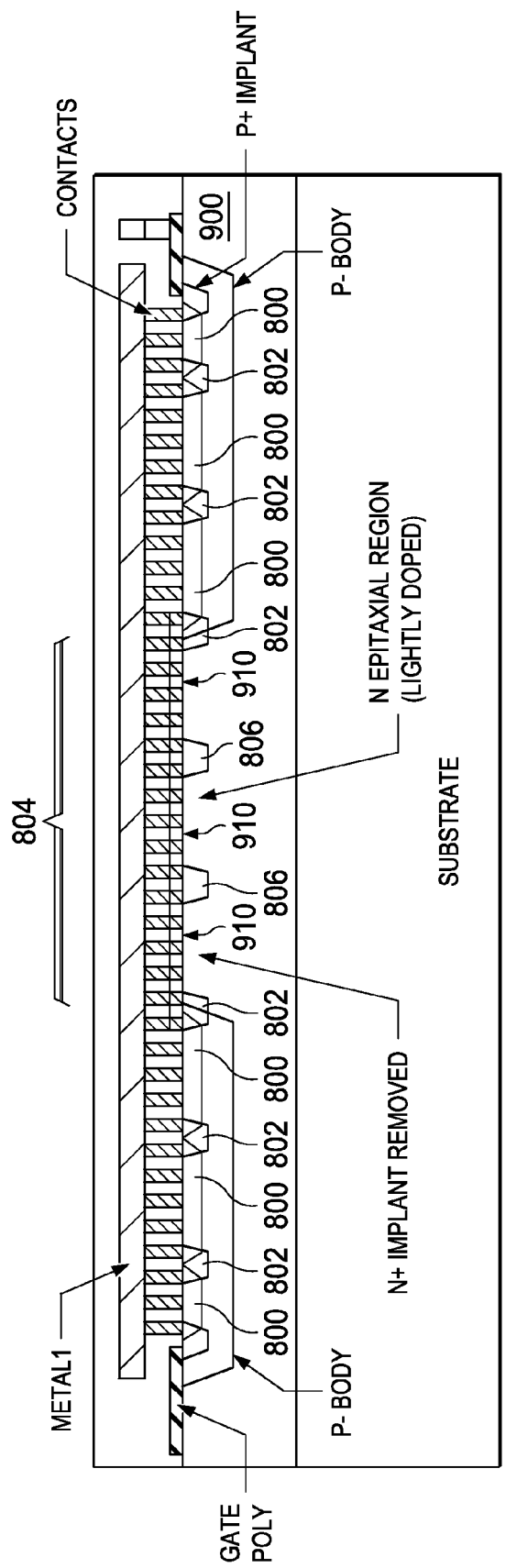
FIG. 9 shows a sectional side view A-A' of another embodiment of an LDMOS with integrated Schottky diode of the invention.

By eliminating the p-body and highly doped n+ source from the region 804 a lightly doped region is provided in the form of an underlying epitaxial layer. This is best shown in FIG. 9, which shows a sectional side view of another embodiment of the source side of an LDMOS device of the invention. For ease of reference the embodiment of FIG. 9 uses the same reference numerals to depict similar structural elements as those in the FIG. 8 embodiment. The epitaxial layer 900 defines the cathodes of the integrated Schottky diodes of the invention. In order to provide an anode, a metalized region is formed over the epitaxial layer 900. In one embodiment of the invention a cobalt silicide layer 910 is formed over the epitaxial layer 900. Each Schottky diode includes at least one contact to define anode and cathode contacts. In the embodiment of FIG. 9 each Schottky diode is provided with three contacts 908 to the silicide layer 910. The contacts provide the anode contact to the Schottky diode. The electrical contact to the epitaxial region 900 in this embodiment is made by means of the drain contact, which contacts the n+ drain region formed in an n-well as best appreciated with respect to the prior art LDMOS device of FIG. 1 and also forms the cathode contact to the Schottky diodes. FIG. 1 shows the n+ drain 110 formed in the n-well 112.

The cobalt silicide forming the anode of the Schottky diodes will, if a typical LDMOS process is used, be formed on top of the lightly doped n-epitaxial region and will provide a Schottky diode with the underlying lightly doped n-epitaxial region.

Figure 10:
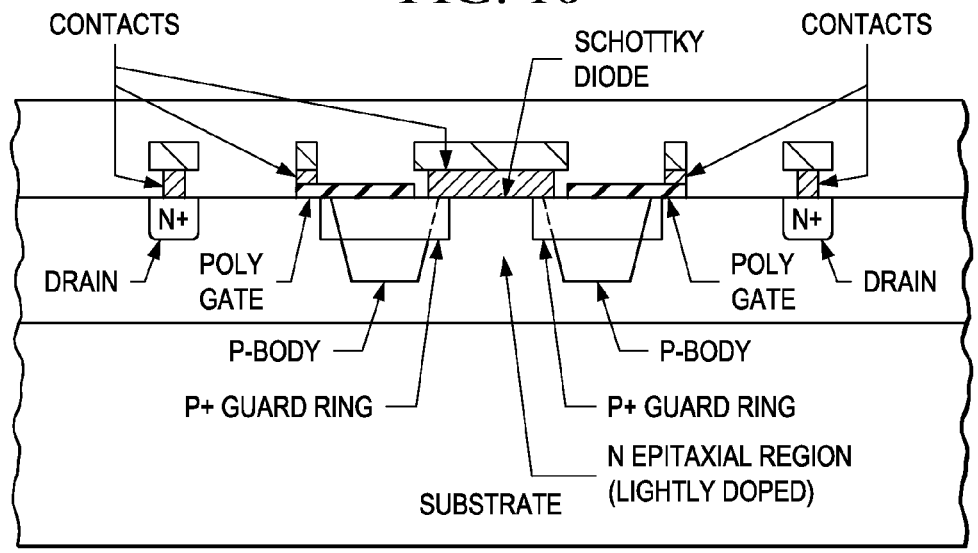
FIG. 10 shows a sectional side view B-B' of another embodiment of an LDMOS with integrated Schottky diode of the invention

In the embodiment of FIG. 10 each Schottky diode is surrounded by a p+ ring for edge termination, to reduce leakage. This also clearly shown in FIGS. 8 and 9.

The present invention thus provides an elegant way of reducing forward conduction loss and reverse recovery time in an LDMOS while maintaining the same process steps. Therefore if a Bipolar CMOS DMOS (BCD) process is used in forming the LDMOS, the present invention allows the BCD process to be used in forming an integrated Schottky diode, in accordance with the invention.

In the above embodiments the Schottky diodes were formed in of the lightly doped n-epitaxial region surrounded by the source/body active region. Schottkys are leakier than regular diodes, hence, only a selected few n+ regions were removed in the source/body active region. The number of n+ source regions eliminated to support Schottky diodes depends on the degree to which high power current has to be supported by the device and the amount of leakage that is acceptable. It will also be noted that each Schottky diode region is surrounded by a p+ ring for edge termination, to reduce leakage.

In the above embodiments leakage reduction is achieved by shorting out the p+ body contact region 802, p-body and n+ source regions 800 by means of a layer of cobalt silicide.

While the implementation was described with respect to particular embodiments, it will be appreciated that the integrated Schottky can be implemented in different ways to achieve integrated Schottky diodes in the source/body active region. Also as discussed above, the number of Schottky diodes created will vary depending on the application.

What is claimed is:

1. An apparatus with at least one Schottky diode integrated into an LDMOS comprising: a substrate; a first layer of lightly doped n-type epitaxial material formed over the substrate; a p-well formed in the first layer, wherein the well has a rectangular surface topology which includes a rectangular aperture in the p-well exposing the under-lying lightly doped n-type material; wherein a long side of the rectangular aperture is aligned with a long side of the p– well and further wherein the sides of the rectangular aperture are inside and spaced apart from the rectangular sides of the p-well; an n+ drain formed in the lightly doped n-type epitaxial region spaced apart from the p-well; at least one Schottky diode formed by providing a metal or metalized region that forms a diode within the surface of the aperture exposing the lightly doped n-type region in the p-well, wherein the metal or metalized region over the diode forms an anode of the diode; wherein the metal or metalized region comprises a silicide region over surface of the aperture exposing the lightly doped n-type region in the p-well; a source divided into multiple n+ source regions by intermediate p+ body contact regions, wherein the p+ body contact regions between the multiple n+ source regions are configured to increase the safe operating area of the apparatus; a p+ ring coupled to the p-well and surrounding each at least one Schottky diode, wherein the p+ ring provides edge termination of the at least one Schottky diode to reduce leakage; and the metal or metalized region coupling the n+ source region, the p+ body contact regions and the anode of the at least one Schottky diode.

2. The apparatus of claim 1, wherein the substrate is silicon.

3. The apparatus of claim 1, wherein the metal or metalized region that forms a diode is Cobalt silicide.

4. The apparatus of claim 1, wherein the metal or metalized region coupling the n+ source region, the p+ body contact regions and the anode of the at least one Schottky diode is aluminum.

5. A method of reducing reverse recovery time in an LDMOS device, comprising integrating a Schottky diode into the LDMOS device by converting part of the LDMOS device into a Schottky diode by; forming a p-well in a first layer, wherein the p-well has a rectangular surface topology which includes a rectangular aperture in the p-well exposing an under-lying lightly doped n-type material of the first layer; forming the Schottky diode by forming a metal or metalized region over the lightly doped n-type region; and forming a source divided into multiple n+ source regions by intermediate p+ well contact regions, wherein the p+ well contact regions between the multiple n+ source regions are configured to increase the safe operating area of the LDMOS.

6. The method of claim 5, wherein the lightly doped n-type region comprises an n-epitaxial region, and n+ drain regions are formed in the n-epitaxial region.

7. The method of claim 5, wherein the Schottky diode is provided with anode and cathode contacts.

8. The method of claim 7, wherein the cathode contact is defined by one or more drain contacts to the LDMOS device.

* * * * *